United States Patent
Huang et al.

(10) Patent No.: US 9,202,916 B2
(45) Date of Patent: Dec. 1, 2015

(54) SEMICONDUCTOR DEVICE STRUCTURE

(71) Applicant: TAIWAN SEMICONDUCTOR MANUFACTURING CO., LTD., Hsin-Chu (TW)

(72) Inventors: Shin-Yeh Huang, Taichung (TW); Kai-Hsiang Chang, Taichung (TW); Chih-Chen Jiang, New Taipei (TW); Yi-Wei Peng, Taichung (TW); Kuan-Yu Lin, Taichung (TW); Ming-Shan Tsai, Xizhou Township (TW); Ching-Lun Lai, Taichung (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/142,396

(22) Filed: Dec. 27, 2013

(65) Prior Publication Data
US 2015/0187940 A1    Jul. 2, 2015

(51) Int. Cl.
H01L 29/76    (2006.01)
H01L 29/94    (2006.01)
H01L 31/062   (2012.01)
H01L 31/113   (2006.01)
H01L 31/119   (2006.01)
H01L 29/78    (2006.01)
H01L 29/10    (2006.01)
H01L 29/66    (2006.01)

(52) U.S. Cl.
CPC ........ H01L 29/7848 (2013.01); H01L 29/1083 (2013.01); H01L 29/6656 (2013.01)

(58) Field of Classification Search
CPC ... H01L 29/66659; H01L 29/76; H01L 29/94; H01L 31/062; H01L 31/113; H01L 31/119; H01L 29/7835; H01L 29/665
USPC .................................. 257/389; 438/198, 285
See application file for complete search history.

(56) References Cited

U.S. PATENT DOCUMENTS

| | | | |
|---|---|---|---|
| 2008/0246057 A1* | 10/2008 | Lin et al. ........................ | 257/190 |
| 2011/0147843 A1* | 6/2011 | Wood et al. .................... | 257/365 |
| 2012/0329252 A1* | 12/2012 | Yoo et al. ...................... | 438/478 |
| 2013/0084682 A1* | 4/2013 | Lee et al. ....................... | 438/198 |
| 2013/0175585 A1* | 7/2013 | Tan et al. ....................... | 257/288 |
| 2014/0138745 A1* | 5/2014 | Shin et al. ...................... | 257/192 |
| 2015/0021688 A1* | 1/2015 | Sung et al. ..................... | 257/344 |

* cited by examiner

*Primary Examiner* — Phuc Dang
(74) *Attorney, Agent, or Firm* — Birch, Stewart, Kolasch & Birch, LLP

(57) ABSTRACT

Embodiments for forming a semiconductor device structure are provided. The semiconductor device structure includes a substrate and a gate stack structure formed on the substrate. The semiconductor device structure also includes gate spacers formed on sidewalls of the gate stack structure. The semiconductor device structure further includes an isolation structure formed in the substrate and a source/drain stressor structure formed adjacent to the isolation structure. The source/drain stressor structure includes a capping layer which is formed along the (311) and (111) crystal orientations.

21 Claims, 4 Drawing Sheets

SEMICONDUCTOR DEVICE STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singularized by sawing between the integrated circuits along a scribe line. The individual dies are typically packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allows more components to be integrated into a given area. These smaller electronic components also require smaller packages that utilize less area than packages of the past, in some applications.

A MOSFET with stressor regions is often formed to enhance the performance of the MOSFET. Various techniques directed at the shapes, configurations, and materials of the source and drain features have been implemented to further improve transistor device performance. Although existing approaches have been generally adequate for their intended purposes, they have not been entirely satisfactory in all respects.

DESCRIPTION OF THE DRAWINGS

For a more complete understanding of the present disclosure and the advantages thereof, reference is now made to the following descriptions taken in conjunction with the accompanying drawings.

DETAILED DESCRIPTION OF THE ILLUSTRATIVE EMBODIMENTS

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Embodiments for forming a semiconductor device structure are provided. FIGS. 1A-1E show cross-sectional representations of various stages of forming a semiconductor device structure 100 in accordance with some embodiments of the disclosure.

Figure 1A:
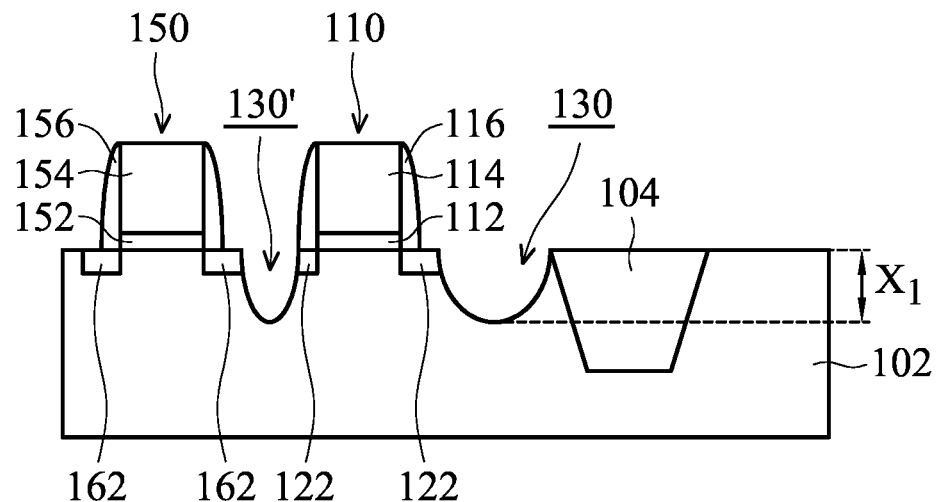
FIGS. 1A-1E show cross-sectional representations of various stages of forming a semiconductor device structure, in accordance with some embodiments of the disclosure.

Referring to FIG. 1A, a substrate 102 is provided. Substrate 102 may be made of silicon or other semiconductor materials. Alternatively or additionally, substrate 102 may include other elementary semiconductor materials such as germanium. In some embodiments, substrate 102 is made of a compound semiconductor such as silicon carbide, gallium arsenic, indium arsenide, or indium phosphide. In some embodiments, substrate 102 is made of an alloy semiconductor such as silicon germanium, silicon germanium carbide, gallium arsenic phosphide, or gallium indium phosphide. In some embodiments, substrate 102 includes an epitaxial layer. For example, substrate 102 has an epitaxial layer overlying a bulk semiconductor.

Substrate 102 may further include isolation structures 104, such as shallow trench isolation (STI) features or local oxidation of silicon (LOCOS) features. The isolation structures 104 may define and isolate various integrated circuit devices.

As shown in FIG. 1A, gate stack structure 110 including a gate dielectric layer 112 and a gate electrode layer 114 is formed on substrate 102.

Gate dielectric layer 112 is formed on substrate 102. Gate dielectric layer 112 may be made of silicon oxide, silicon oxynitride, or a high dielectric constant material (high-k material). The high dielectric constant material may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or other suitable high-k dielectric materials. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, or other suitable materials. Gate dielectric layer 112 may be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, or other suitable processes.

Afterwards, gate electrode layer 114, made of a material, such as polysilicon, metal or metal silicide, is formed on the gate dielectric layer 112. In some embodiments, gate electrode layer 114 is made of a polysilicon layer which serves as a dummy gate that is replaced in a subsequent gate replacement process. In some embodiments, gate electrode layer 114 is formed using a CVD process.

Gate spacers 116 are formed on the opposite sidewalls of the gate stack structure 110. In some embodiments, a dielectric layer is deposited over semiconductor substrate 102, and an etching process is performed to remove a portion of the dielectric layer to form gate spacers 116. Gate spacers 116 are made of silicon oxide, silicon nitride, silicon oxynitride, and/or dielectric materials. Gate spacers 116 may include one layer or multiple layers.

In addition, another gate stack structure 150 is formed on substrate 102. Gate stack structure 150 includes a gate dielectric layer 152 and a gate electrode layer 154. Gate spacers 156 are formed on sidewalls of gate stack structure 150.

After forming gate spacers 116 and 156, doped regions 122, 162 are formed in semiconductor substrate 102 as shown in FIG. 1A in accordance with some embodiments of the disclosure. Doped regions 122, 162 are aligned with an inner side of gate spacers 116, 156. In some embodiments, doped regions 122,162 are doped with an n-type dopant, such as arsenic (As), phosphorous (P) or antimony (Sb). In some other embodiments, doped regions 122,162 are doped with a p-type dopant, such as boron (B) or boron fluorine ($BF_2$). In some embodiments, doped regions 122,162 are doped with arsenic (As) having a concentration in a range from about $1 \times 10^{12}$ to about $1 \times 10^{15}$ atom/$cm^2$. Doped regions 122,162 have a gradient dopant concentration, and dopant concentration is decreased from inner side to outer side of doped regions 122,162.

In some embodiments, an ion implantation (IMP) process (not shown) is performed to form doped regions 122,162. In some embodiments, the ion implantation (IMP) process is operated under a power in a range from about 10 keV to about 80 keV.

Afterwards, a dry etching process (not shown) is performed to remove a portion of semiconductor substrate 102 and to form recesses 130 and 130' as shown in FIG. 1A in accordance with some embodiments of the disclosure. In some embodiments, the dry etching process includes a plasma etching process. Recess 130 is formed between gate stack structure 110 and isolation structure 104, and recess 130' is formed between gate stack structure 110 and gate stack structure 150.

In some embodiments, an etching gas used in the dry etching process includes helium (He), argon (Ar), chlorine ($Cl_2$), oxygen ($O_2$), HBr, $N_2$, $CF_4$ and $CH_3F$. In some embodiments, a chlorine ($Cl_2$) to helium (He) ratio in a range from about 0.1 to about 10.

As shown in FIG. 1A, recesses 130, 130' have a rounded shape. In some embodiments, recess 130 has a depth $X_1$ in a range from about 50 nm to about 90 nm.

In some embodiments, a wet etching process (not shown) is performed after the dry etching process to enlarge the recess 130 to form an enlarged recess (not shown). In some embodiments, the wet etching process includes an etching solution including TMAH (tetramethyl ammonium hydroxide), $NH_4OH$, KOH (potassium hydroxide), HF (hydrofluoric acid), or other applicable etching solutions.

Figure 1B:
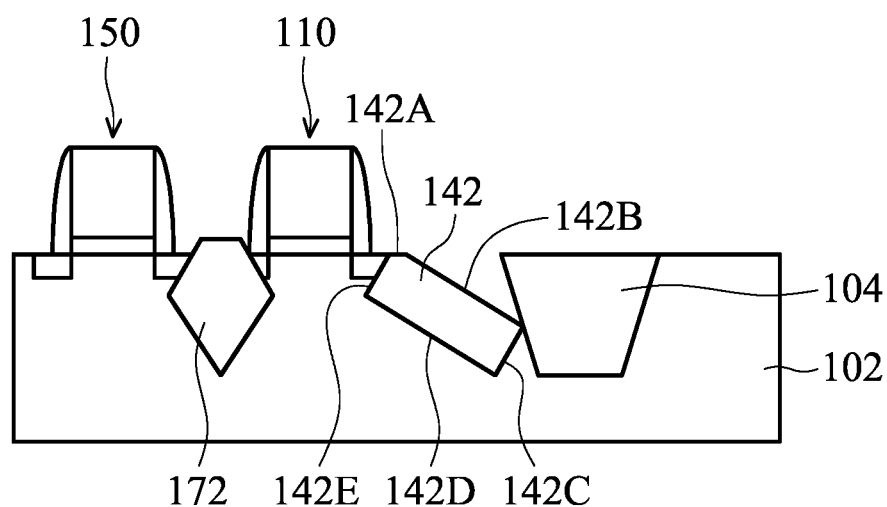

After recesses 130 and 130' are formed, a stressor layer 142 is formed in recess 130 as shown in FIG. 1B in accordance with some embodiments of the disclosure. A channel region of semiconductor device 100 is strained by stressor layer 142. For an n-type MOS (NMOS) device, a tensile strain is induced to the channel region by stressor layer 142. For a p-type MOS (PMOS) device, a compressive strain is induced to the chancel region by stressor layer 142.

As shown in FIG. 1B, stressor layer 142 has a pentagonal shape. In some embodiments, stressor layer 142 has a first facet 142A, a second facet 142B, a third facet 142C, a fourth facet 142D and a fifth facet 142E. In addition, stressor layer 172 is formed in recess 130' and it also has a pentagonal shape.

In some embodiments, stressor layers 142 and 172 are made of SiGe. In some embodiments, stressor layer 142 is formed by an epitaxy or epitaxial (epi) process. The epi process may include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epi processes. The epi process may use gaseous and/or liquid precursors, which may interact with the composition of semiconductor substrate 102.

It should be noted that the surface free energy of isolation structure 104 made of oxide is higher than that of substrate 102 made of silicon. In order to balance the surface free energy of isolation structure 104, stressor layer 142 adjacent to isolation structure 104 has a close-packed structure. In some embodiments, stressor layer 142 is grown along (311) and (111) crystal orientations. For example, first facet 142A is grown along (311) crystal orientation, and second facet 142B is grown along (111) crystal orientation.

In some embodiments, stressor layer 172 is formed between gate stack structure 110 and gate stack structure 150. Compared with stressor layer 142, stressor layer 172 is farther away from isolation structure 104 and therefore it is formed without having a close-packed structure. In some embodiments, stressor layer 172 is grown along (111) and (100) crystal orientations.

Figure 1C:
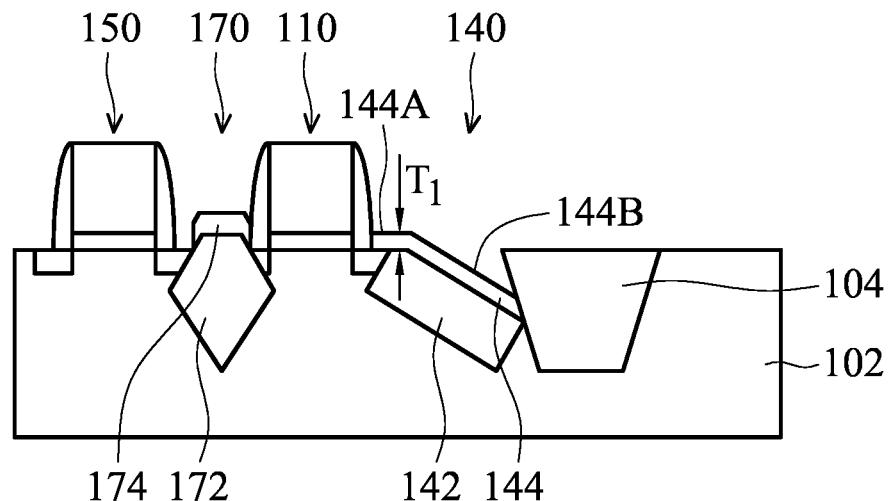

After stressor layer 142 is formed, capping layer 144 is formed on stressor layer 142 as shown in FIG. 1C in accordance with some embodiments of the disclosure. Capping layer 144 is provided to lower the sheet resistance of stressor layer 142 to provide excellent contact characteristics. A source/drain stressor structure 140 is constructed by stressor layer 142 and capping layer 144.

Capping layer 144 is a silicon-containing layer. In some embodiments, capping layer 144 is made of SiGe, Si, SiC or SiGeSn. A portion of capping layer 144 overlying the stressor layer 142 is raised above the top surface of substrate 102. A portion of capping layer 144 overlying the stressor layer 142 is below the top surface of substrate 102. Capping layer 144 is also grown along (311) and (111) crystal orientations. For example, capping layer 144 has a first facet 144A and a second facet 144B. First facet 144A is grown along (311) crystal orientation, and second facet 144B is grown along (111) crystal orientation. In some embodiments, capping layer 144 is formed by a selective epitaxial growth (SEG) process.

In addition, like capping layer 144, capping layer 174 is formed on stressor layer 172. Capping layer 174 overlying the stressor layer 172 is raised above the top surface of substrate 102. A source/drain stressor structure 170 is constructed by stressor layer 172 and capping layer 174. In some embodiments, capping layer 174 is made of SiGe, Si, SiC or SiGeSn. In some embodiments, capping layer 174 is formed by a selective epitaxial growth (SEG) process.

It should be noted that capping layer 144 is formed over stressor layer 142, and therefore capping layer 144 is grown along the growth direction of stressor layer 142. The boundaries between stressor layer 142 and capping layer 144 are grown along the (311) and (111) crystal orientation. Since stressor layer 142 has a close-packed structure, capping layer 144 also has a close-packed structure. In other words, capping layer 144 follows the shape of stressor layer 142. In addition, in order to form the close-packed structure, the facet growth rate for forming capping layer 144 is slower than that for forming capping layer 174. Therefore, as shown in FIG. 1C, capping layer 144 is slanted downward from doped regions 122 to isolation structure 104, and a portion of capping layer 174 is below the top surface of substrate 102.

Figure 1D:
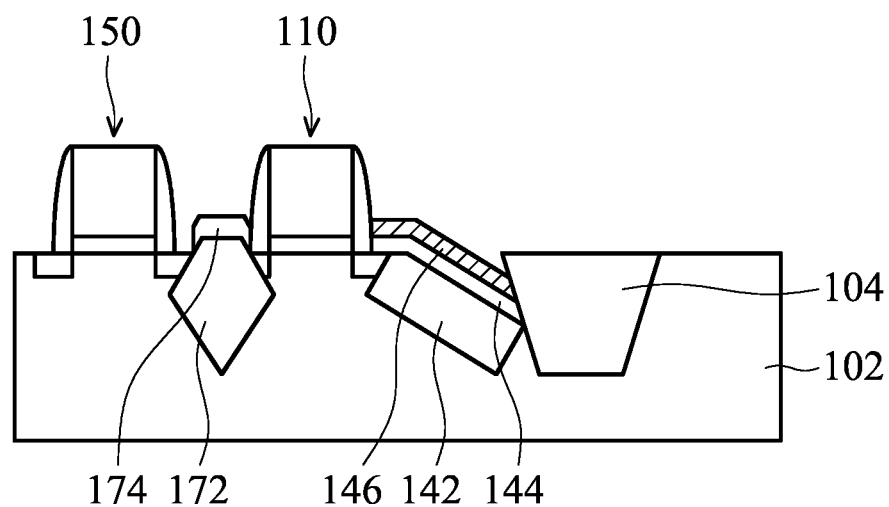

In addition, in order to form the close-packed structure, atoms for forming capping layer 144 have to be in supplied sufficient quantities, or a thin capping layer may be formed. For example, if the silicon sources for forming capping layer 144 are insufficient, capping layer 144 is too thin to form a metal silicide layer (formed afterwards, as shown in FIG. 1D) over it. As a result, a poor-quality metal silicide layer and contact structure are formed. Therefore, short circuiting and current leakage problems coming from high contact resistance may occur.

In order to resolve short circuiting and current leakage problems, in some embodiments, the silicon source for forming capping layer 144 during the epitaxial process is well-controlled to form a thicker capping layer 144. The control method will be described in detail in FIG. 2. In some embodiments, capping layer 144 has a thickness $T_1$ in a range from about 10 nm to about 30 nm.

After capping layer 144 is formed, a metal silicide layer 146 is formed on capping layer 144 as shown in FIG. 1D in accordance with some embodiments of the disclosure. For example, a metal film is deposited on capping layer 144 to be in direct contact with the exposed silicon surface of capping layer 144. Any suitable process, such as a PVD process, CVD process, plating process, electroless plating process, and/or the like, may be performed to form the metal film. Afterwards, a heating operation is then carried out to cause a reaction between the deposited metal film and the exposed silicon surface, therefore forming metal silicide layer 146. The unreacted portion of the deposited metal film is then removed, for example, by using an etching process. Metal silicide layer 146 has a lower resistance than non-silicided regions, especially in smaller geometries.

Figure 1E:
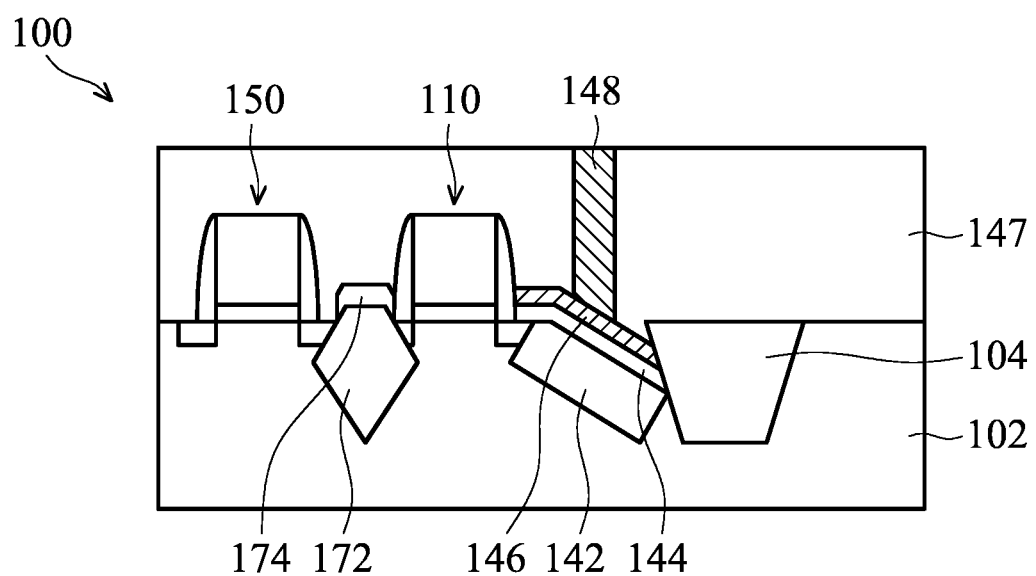

After metal silicide layer 146 is formed, an inter-layer dielectric (ILD) layer 147 is formed on substrate 102, and a contact structure 148 is formed in ILD layer 147 as shown in FIG. 1E in accordance with some embodiments of the disclosure. For example, an opening (not shown) is formed in ILD layer 147, and a conductive material is filled into the opening to form contact structure 148. Contact structure 148 is in direct contact with metal silicide layer 146. Contact structures 148 are made of conductive materials, such as copper, or copper alloy. As a result, semiconductor device structure 100 is formed.

Afterwards, substrate 102 may continue with other processes to form other devices, such as inter-metal dielectric (IMD) layers or interconnect structures. The advantage of embodiments of the disclosure is that a thicker capping layer 144 of source/drain stressor structure 140 adjacent to isolation structure 104 is obtained by controlling the silicon sources during the formation of capping layer 144. Therefore, the quality of metal silicide layer 146 is improved by forming a thicker capping layer 144. In addition, the quality of contact structure 148 is further improved. Moreover, a process window of the opening used for forming contact structure 148 is enlarged.

Figure 2:
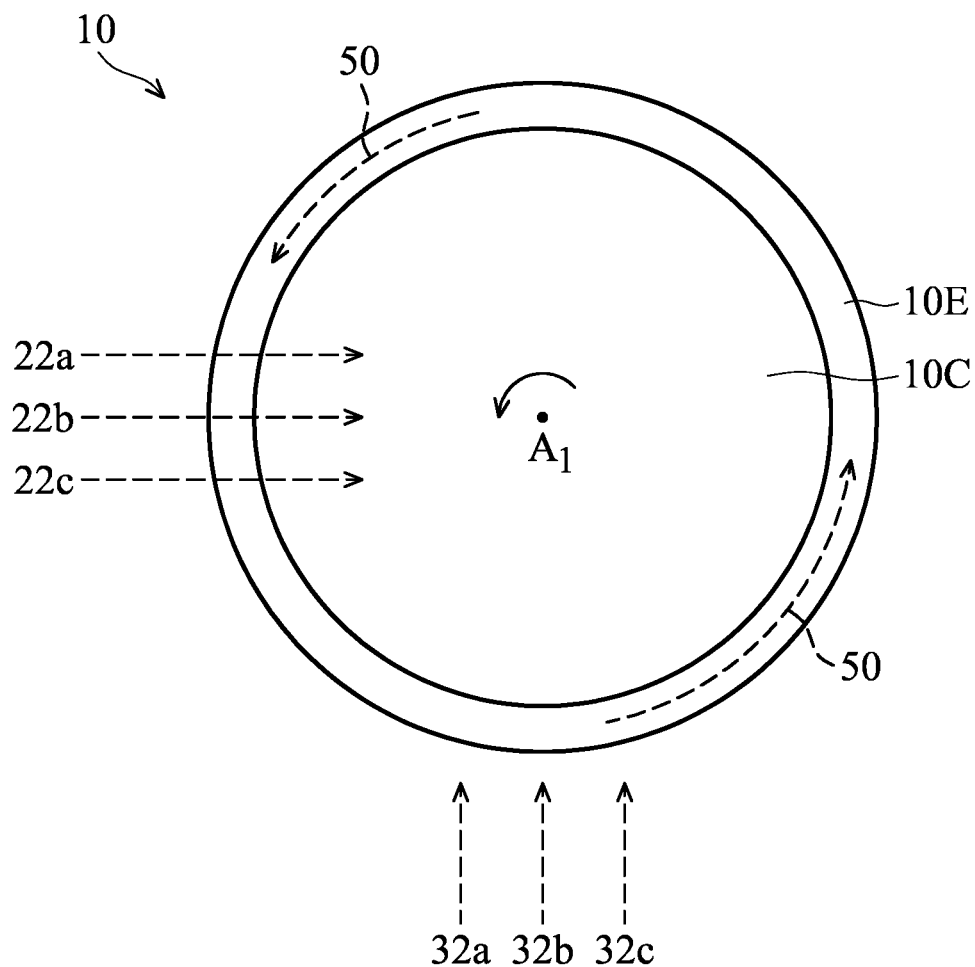
FIG. 2 shows a top-view representation of a wafer during an epitaxial process, in accordance with some embodiments of the disclosure.

FIG. 2 shows a top-view representation of a wafer during an epitaxial process, in accordance with some embodiments of the disclosure. In some embodiments, the epitaxial process is a selective epitaxial growth (SEG) process.

Referring to FIG. 2, a wafer 10 is provided. Wafer 10 has a central region 10C and an edge region 10E. A number of semiconductor device structures 100 (shown in FIG. 1E) are formed on central region 10C and edge region 10E of wafer 10.

Some source gas includes silicon source gas or germanium source gas. In some embodiments, the silicon source gas for forming capping layer 144 includes mono silane ($SiH_4$), disilane ($Si_2H_6$), dichloro silane (DCS, $SiH_2Cl_2$), hexachloro disilane (HCD), bis(ethlymethylamino) silane (BEMAS), bis (diethylamino) silane (BDEAS), Bis(dimethylamino) silane (BDMAS), tris(dimethylamino) silane (Tris-DMAS), tetrakis(dimethylamino) silane (TDMAS), tris(ethlymethylamino) silane (Tris-EMAS), diethylamino silane (DEAS), bis(tertybutylamino) silane (BTBAS), or di-isopropyl-amino-silane (DIPAS). The germanium source gas is such as germane ($GeH_4$). In addition, a reaction source gas, etching gas (such as HCl), and carrier gas (such as hydrogen (HD), are also used during the selective epitaxial process.

As shown in FIG. 2, a number of main gas suppliers 22a, 22b and 22c are supplied to central region 10C, and a number of edge gas suppliers 32a, 32b and 32c are supplied to edge region 10E. In some embodiments, main gas suppliers 22a, 22b and 22c introduce mono silane ($SiH_4$), germane ($GeH_4$) and HCl, respectively. In some other embodiments, edge gas suppliers 32a, 32b and 32c introduce mono silane ($SiH_4$), germane ($GeH_4$) and HCl, respectively.

In some embodiments, source gas is supplied along with carrier gas. The flow rate of carrier gas at central region 10C is higher than that at edge region 10E. In some embodiments, the flow rate of the carrier gas at central region 10C is in a range from about 10 slm to about 50 slm. In some embodiments, the flow rate of the carrier gas at edge region 10E is in a range from about 200 sccm to about 2000 sccm.

In some embodiments, wafer 10 is rotated about the axis A1. Since wafer 10 is rotated, the source gas supplied from main gas suppliers 22a, 22b and 22c may be diffused from central region 10C to edge region 10E. Accordingly, the concentration of source gas at edge region 10E is smaller than that at central region 10C. The non-uniform concentration of source gas may cause deficiency at edge region 10E. In order to make up this deficiency, edge gas suppliers 32a, 32b and 32c are independently supplied to edge region 10E as indicated by arrows 50 shown in FIG. 2.

In addition, short circuiting and current leakage problems of semiconductor device 100 are more serious on edge region 10E than on central portion 10C due to the source gas being insufficiently supplied at edge region 10E. As mentioned above, silicon source gas for forming capping layer 144 during the selective epitaxial process is well-controlled to form a thicker capping layer 144. Therefore, the selective epitaxial growth (SEG) process at edge region 10E for forming capping layer 144 and/or stressor layer 142 is controlled to meet the equation (I):

edge–E/D=flow rate of HCl source/sum of the flow rates of a Si source and a Ge source     (I), In some embodiments, the edge–E/D value is in a range from about 0.2 to about 0.8. If the edge–E/D value is too large, there is not enough source gas to supply to wafer 10, and therefore a thinner capping layer 144 is obtained. On the contrary, if the edge–E/D value is too small, severe selectivity loss may take place and results in poor quality of epitaxial layer.

In some embodiments, the source gas for forming stressor layer 142 at edge region 10E is in a range from about 100 sccm to about 400 sccm. In some other embodiments, the source gas for forming capping layer 144 at edge region 10E is in a range from about 50 sccm to about 200 sccm.

In some embodiments, the selective epitaxial process for forming stressor layer 142 and/or capping layer 144 is performed at a temperature in a range from about 500° C. to about 850° C. In some other embodiments, the elective epitaxial process for forming stressor layer 142 and/or capping layer 144 is performed at a pressure in a range from about 1 torr to about 760 torr.

The thickness of capping layer 144 at edge region 10E is well-controlled by the edge-E/D value. The source gas is supplied sufficiently to match the facet growth rate of capping layer 144, especially at edge region 10E. Therefore, the thickness of capping layer 144 is enough to form a high quality of metal silicide layer 146 and contact structure 148.

Embodiments for forming a semiconductor device are provided. A source/drain stressor structure is formed between a gate stack structure and an isolation structure. The source/drain stressor structure has a stressor layer and a capping layer. The capping layer has a thickness sufficient to form a high quality of a metal silicide layer and a contact structure. Therefore, short circuiting and current leakage problems are resolved. In addition, a larger process window is available for forming the contact structure.

In some embodiments, a semiconductor device structure is provided. The semiconductor device structure includes a substrate and a gate stack structure formed on the substrate. The semiconductor device structure also includes gate spacers formed on sidewalls of the gate stack structure. The semiconductor device structure further includes an isolation structure formed in the substrate and a source/drain stressor structure formed adjacent to the isolation structure. The source/drain stressor structure includes a capping layer which is formed along the (311) and (111) crystal orientations.

In some embodiments, a semiconductor device structure is provided. The semiconductor device structure includes a substrate and a gate stack structure formed on the substrate. The semiconductor device structure also includes gate spacers formed on sidewalls of the gate stack structure and doped regions formed in the substrate. The semiconductor device structure further includes an isolation structure formed in the substrate and a source/drain stressor structure formed between the doped regions and the isolation structure. The source/drain stressor structure includes a stressor layer formed in the substrate and a capping layer formed above the stressor layer. The capping layer is slanted downward from the doped regions to the isolation structure.

In some embodiments, a method for forming a semiconductor device structure is provided. The method includes providing a wafer, and the wafer has a central portion and an edge portion. The method also includes forming a semiconductor device structure on the central portion and the edge portion which includes forming an isolation structure in the edge portion of the wafer; forming a gate stack structure on the edge portion of the wafer; forming gate spacers on sidewalls of the gate stack structure; doping the wafer below the gate spacers to form doped regions; and growing a source/drain stressor structure between the doped regions and the isolation structure. The source/drain stressor structure includes a capping layer which is formed along the (311) and (111) crystal orientations.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor device structure, comprising:
   a substrate;
   a gate stack structure formed on the substrate;
   gate spacers formed on sidewalls of the gate stack structure;
   an isolation structure formed in the substrate; and
   a source/drain stressor structure formed adjacent to the isolation structure, wherein the source/drain stressor structure comprises a capping layer which is formed along the (311) and (111) crystal orientations,
   wherein the source/drain stressor structure further comprises: a stressor layer formed between the substrate and the capping layer, and
   wherein a portion of the stressor layer is grown along the (311) and (111) crystal orientations.

2. The semiconductor device structure as claimed in claim 1, wherein the capping layer comprises SiGe, Si, SiC or SiGeSn.

3. The semiconductor device structure as claimed in claim 1, wherein a portion of the capping layer is below a top surface of the substrate.

4. The semiconductor device structure as claimed in claim 1, wherein the capping layer has a thickness in a range from about 10 nm to about 30 nm.

5. The semiconductor device structure as claimed in claim 1, wherein the semiconductor device structure is at an edge region of a wafer.

6. The semiconductor device structure as claimed in claim 1, further comprising:
   a metal silicide layer formed on the source/drain stressor structure.

7. The semiconductor device structure as claimed in claim 6, further comprising:
   a contact structure formed on the metal silicide layer, wherein the source/drain stressor structure is connected to the contact structure by the metal silicide layer.

8. The semiconductor device structure as claimed in claim 1, further comprising:
   gate spacers formed on sidewalls of the gate stack structure; and
   doped regions formed in the substrate.

9. The semiconductor device structure as claimed in claim 8, wherein the doped regions are aligned with an inner side of the gate spacers.

10. The semiconductor device structure as claimed in claim 8, wherein the capping layer is slanted downward from the doped regions to the isolation structure.

11. The semiconductor device structure as claimed in claim 1, wherein the capping layer has a close-packaged structure.

12. A semiconductor device structure, comprising:
    a substrate;
    a gate stack structure formed on the substrate;

gate spacers formed on sidewalls of the gate stack structure;

doped regions formed in the substrate;

an isolation structure formed in the substrate; and a source/drain stressor structure formed between the doped regions and the isolation structure, wherein the source/drain stressor structure comprises:

a stressor layer formed in the substrate, wherein a portion of the stressor layer is grown along the (311) and (111) crystal orientations; and a capping layer formed above the stressor layer, and wherein the capping layer is slanted downward from the doped regions to the isolation structure.

13. The semiconductor device structure as claimed in claim 12, wherein the capping layer has a first facet grown along the (311) crystal orientation and a second facet grown along the (111) crystal orientation, and the first facet has a first thickness and the second facet has a second thickness, and the first thickness is substantially equal to the second thickness.

14. The semiconductor device structure as claimed in claim 12, wherein a portion of the capping layer is below a top surface of the substrate.

15. The semiconductor device structure as claimed in claim 12, wherein the boundaries between the stressor layer and the capping layer are grown along the (311) and (111) crystal orientations.

16. The semiconductor device structure as claimed in claim 12, wherein the capping layer has a close-packaged structure.

17. The semiconductor device structure as claimed in claim 12, wherein the semiconductor device structure is at an edge region of a wafer.

18. The semiconductor device structure as claimed in claim 10, wherein the capping layer comprises SiGe, Si, SiC or SiGeSn.

19. A semiconductor device structure, comprising:

a substrate;

a gate stack structure formed on the substrate;

gate spacers formed on sidewalls of the gate stack structure;

an isolation structure formed in the substrate;

a source/drain stressor structure formed adjacent to the isolation structure, wherein the source/drain stressor structure comprises a capping layer which is formed along the (311) and (111) crystal orientations; and a metal silicide layer formed on the source/drain stressor structure.

20. A semiconductor device structure, comprising:

a substrate;

a gate stack structure formed on the substrate;

gate spacers formed on sidewalls of the gate stack structure;

an isolation structure formed in the substrate; and a source/drain stressor structure formed adjacent to the isolation structure, wherein the source/drain stressor structure comprises a capping layer which is formed along the (311) and (111) crystal orientations; and wherein the capping layer has a close-packaged structure.

21. A semiconductor device structure, comprising:

a substrate;

a gate stack structure formed on the substrate;

gate spacers formed on sidewalls of the gate stack structure;

doped regions formed in the substrate;

an isolation structure formed in the substrate; and a source/drain stressor structure formed between the doped regions and the isolation structure, wherein the source/drain stressor structure comprises:

a stressor layer formed in the substrate; and a capping layer formed above the stressor layer, and wherein the capping layer is slanted downward from the doped regions to the isolation structure, wherein the capping layer has a close-packaged structure.

* * * * *